United States Patent
Visscher

(10) Patent No.: US 6,593,581 B2
(45) Date of Patent: Jul. 15, 2003

(54) OBJECT CARRIER FOR A PARTICLE-OPTICAL APPARATUS

(75) Inventor: Albert Visscher, Veldhoven (NL)

(73) Assignee: FEI Company, Hillsboro, OR (US)

( * ) Notice: Subject to any disclaimer, the term of this patent is extended or adjusted under 35 U.S.C. 154(b) by 261 days.

(21) Appl. No.: 09/767,570

(22) Filed: Jan. 23, 2001

(65) Prior Publication Data

US 2001/0011707 A1 Aug. 9, 2001

(30) Foreign Application Priority Data

Feb. 4, 2000 (EP) .......................................... 00200362

(51) Int. Cl.$^7$ ................................................. G21K 5/10
(52) U.S. Cl. ............................................... 250/442.11
(58) Field of Search ...................... 250/442.11; 414/217, 414/935; 205/186

(56) References Cited

U.S. PATENT DOCUMENTS

| 5,605,574 A | * | 2/1997 | Tsunashima et al. | ........ 118/500 |
| 5,691,876 A | * | 11/1997 | Chen et al. | .................. 361/234 |
| 5,834,737 A | * | 11/1998 | Hirose et al. | ................ 219/390 |
| 5,896,877 A | * | 4/1999 | Pirker | ........................ 134/153 |
| 5,908,334 A | * | 6/1999 | Chen et al. | .................. 439/824 |
| 6,104,002 A | * | 8/2000 | Hirose et al. | ................ 219/390 |
| 6,113,056 A | | 9/2000 | Armstrong | |
| 6,264,804 B1 | * | 7/2001 | Lee et al. | .................... 118/503 |
| 6,435,798 B1 | * | 8/2002 | Satoh | .......................... 118/728 |
| 6,436,267 B1 | * | 8/2002 | Carl et al. | ................... 205/186 |

* cited by examiner

Primary Examiner—John R. Lee
Assistant Examiner—Johnnie L Smith, II
(74) Attorney, Agent, or Firm—Michael O. Scheinberg; Erik R. Nordstrom

(57) ABSTRACT

Objects such as semiconductor wafers to be studied in a scanning electron microscope (SEM) are subject to vibrations which are intensified by vibration resonance of the (thin) wafer, so that the resolution of the SEM is severely degraded. In prior art it is known to support the wafer by means of elastic support members. However, such support members do not counteract the detrimental vibrations. According to the invention there are provided elastic support elements 28 that can accommodate to the inevitable shape errors of the wafer 18 and hence remain in contact with the wafer surface 32. Moreover, the support elements are embodied in such a manner that frictional contact exists between the moving part 38 of the support element and the body 34 of the object carrier 20. The support elements thus provide support which is elastic for macroscopic support but hard for the vibrational movements in the nanometer range, thus inhibiting such vibrational movements.

18 Claims, 5 Drawing Sheets

OBJECT CARRIER FOR A PARTICLE-OPTICAL APPARATUS

The invention relates to a particle-optical apparatus for irradiating an object by means of a beam of electrically charged particles, which apparatus is provided with an object carrier for carrying the object to be irradiated, which object carrier is provided with a system of support elements for supporting the object, which system of support elements defines a substantially flat support surface, the support elements being resiliently movable in a direction transversely of the support surface.

U.S. Pat. No. 5,605,574 discloses an apparatus for the treatment of wafers for integrated semiconductor circuits. In this known apparatus an object, being the semiconductor wafer, is carried by an object carrier which is provided with a number of support elements for supporting the wafer being treated in the apparatus. For uniform support of the wafer the support points of the support elements together define a substantially flat support surface. The wafers to be treated, however, are not completely flat and, moreover, the shape error of individual wafers varies highly. In order to make all support elements participate in supporting the wafer to a more or less equal degree despite the shape errors, they are constructed so as to be elastic so that they can accommodate to the shape errors even when the flatness of the wafer changes during the treatment.

It may be desirable to irradiate the wafers being treated during the production of integrated circuits by means of a beam of electrically charged particles such as electrons or ions. Such irradiation may be aimed at inspection or treatment of the wafers, for example, the repair of defects in the integrated circuit by means of an ion beam. This usually requires a resolution of the order of magnitude of one percent of the smallest detail size of the integrated circuits; considering the contemporary of detail size this means a resolution of approximately 3 nm.

Vibrations are liable to occur in the wafers which are elastically supported in the known manner (which wafers have a diameter of 30 cm according to the present state of the art), the vibration direction extending mainly perpendicularly to the surface of the wafer. Such vibrations are caused, for example by acoustic vibrations in the vicinity of the particle-optical apparatus (for example, an electron microscope) which are transferred to the apparatus via the ambient atmosphere, or by building vibrations which penetrate as residual vibrations despite the resilient and damped mounting of such an apparatus. The vibrations are transferred to the wafers in given points (for example, near fixed points); other regions of the wafer may then exhibit a substantially higher vibration deviation due to resonance. The amplitude of such vibrations due to resonance is not reduced because, since the wafers are situated in vacuum in such apparatus, no damping effect is exerted by an ambient atmosphere. Consequently, such vibrations may reach an amplitude which is much higher than that encountered in comparable situations in atmospheric circumstances.

When the axis of the irradiating ion beam or electron beam extends perpendicularly to the vibrating surface, such a vibration will cause, generally speaking, only a slight loss of resolution. For the inspection of wafers, however, it is often necessary to irradiate the wafer in a tilted position relative to the beam, the angle of tilt then amounting to as much as 60°; this means that the angle between the beam axis and the wafer surface amounts to 30°. The transverse displacement then caused relative to the beam by the vibration of the surface region to be observed is of the same order of magnitude as the vibration amplitude. Such a transverse displacement makes it impossible to achieve said required resolution of 3 nm.

It is an object of the invention to provide a particle-optical apparatus of the kind set forth wherein the amplitude of said wafer vibrations is substantially lower than in the case of the known elastic support. To this end, the apparatus according to the invention is characterized in that the support elements which are resiliently movable transversely of the support surface are in frictional contact with the object carrier. The invention is based on the recognition of the fact that the combination of two steps is necessary so as to counteract the vibrations which are detrimental to the desired resolution. The first step of this combination consists in ensuring that all of the support points of the support elements contact the wafer to be supported, irrespective of the shape errors of the individual wafers relative to the ideal flat surface. This is achieved in that the support elements are resiliently movable in the direction transversely of the support surface. The second step of the combination consists in ensuring that the support elements, all of which make contact with the wafer, actually retain the wafer, i.e. that they prevent the vibration of the wafer in the support point (and hence also in the vicinity thereof). This is achieved by bringing the support elements in frictional contact with the object carrier. The maximum frictional force of a support element should then be such that the forces which would be induced by the vibrations in the wafer in the vicinity of the relevant support element can be compensated by the frictional force. It has been found that for the known values of the friction coefficients between, for example metals, this condition can be readily satisfied in practical circumstances.

The support elements in a preferred embodiment of the invention are constructed as a cylindrical body which is arranged in a cylindrical cavity and is in frictional contact with the inner wall of the cylindrical cavity. Support points are thus obtained with a suitably defined location and the element providing the actual resilience (for example, a coil spring) can be firmly located in the cylindrical cavity so that it can exert in suitably reproducible spring force on the cylindrical body.

The cylindrical body in a further embodiment of the invention is provided with a protrusion which is eccentrically situated relative to the cylinder axis of the body and projects from the cylindrical cavity in a direction transversely of the support surface. In this embodiment it is simply achieved that the positioning of the object produces a frictional force which is proportional to the force exerted on said protrusion by the object. This is achieved by way of the eccentric arrangement of the protrusion so that when the cylindrical body is compressed, the body is laterally pressed against the inner wall of the cylindrical cavity. The resultant frictional force is proportional to the force acting on the protrusion in the direction of the cylinder axis.

The invention and its advantages will be described in detail hereinafter with reference to the Figures in which corresponding reference numerals denote corresponding elements. Therein:

Figure 1:
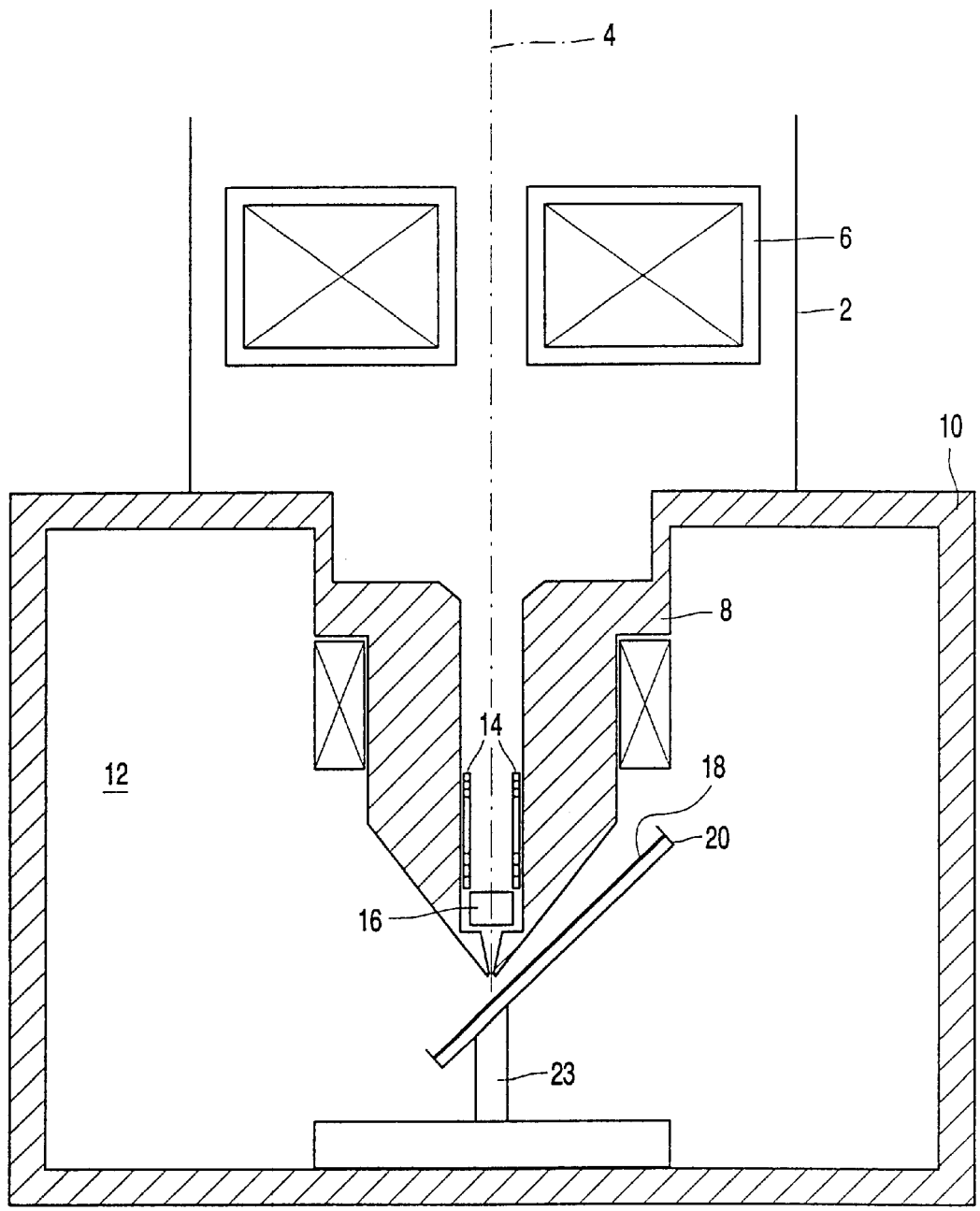
FIG. 1 shows diagrammatically a relevant part of a particle-optical apparatus in which the invention can be used.

FIG. 1 is a general view of a relevant part of a particle-optical apparatus in which the invention can be used. The Figure shows a particle-optical instrument in the form of a part of a column 2 of a scanning electron microscope (SEM). As is customary, an electron source in this instrument (not shown) produces a beam of electrons (the primary beam) which travels along the optical axis 4 of the apparatus. This electron beam can traverse one or more electromagnetic lenses, such as the condenser lens 6, after which the electron beam ultimately reaches the objective lens 8. This lens, being a so-called monopole lens in the present embodiment, forms part of a magnetic circuit which also includes the wall 10 of the specimen chamber 12. The objective lens 8 is used to form a primary beam focus for scanning the object 18 in the form of a semiconductor wafer which is arranged underneath the objective lens. The object 18 is scanned by moving the electron beam across the object in two mutually perpendicular directions by means of scan coils 14 which are provided in the bore of the objective lens 8. The object is arranged on an object carrier 20 which is to be described in detail hereinafter and forms part of an object stage 23. The object carrier 20 can be displaced in two mutually perpendicular directions, thus enabling the selection of a desired region of the object for examination; moreover, the object carrier 20 can be tilted relative to the object stage 23. The objective 8 thus serves as a focusing device for forming a focus of the primary beam in the vicinity of the object on the object carrier 20.

The imaging in such a microscope is realized by making electrons from the primary beam land on the object, thus releasing secondary electrons from the object; these secondary electrons travel back in the direction of the lens 8. Such secondary electrons are detected by a detector 16 which is arranged in the bore of this lens. To this detector there is connected a processing unit (not shown) for activating the detector and for converting the flow of detected electrons into a signal which is suitable for forming an image of the object, for example by means of a cathode ray tube.

Figure 2:
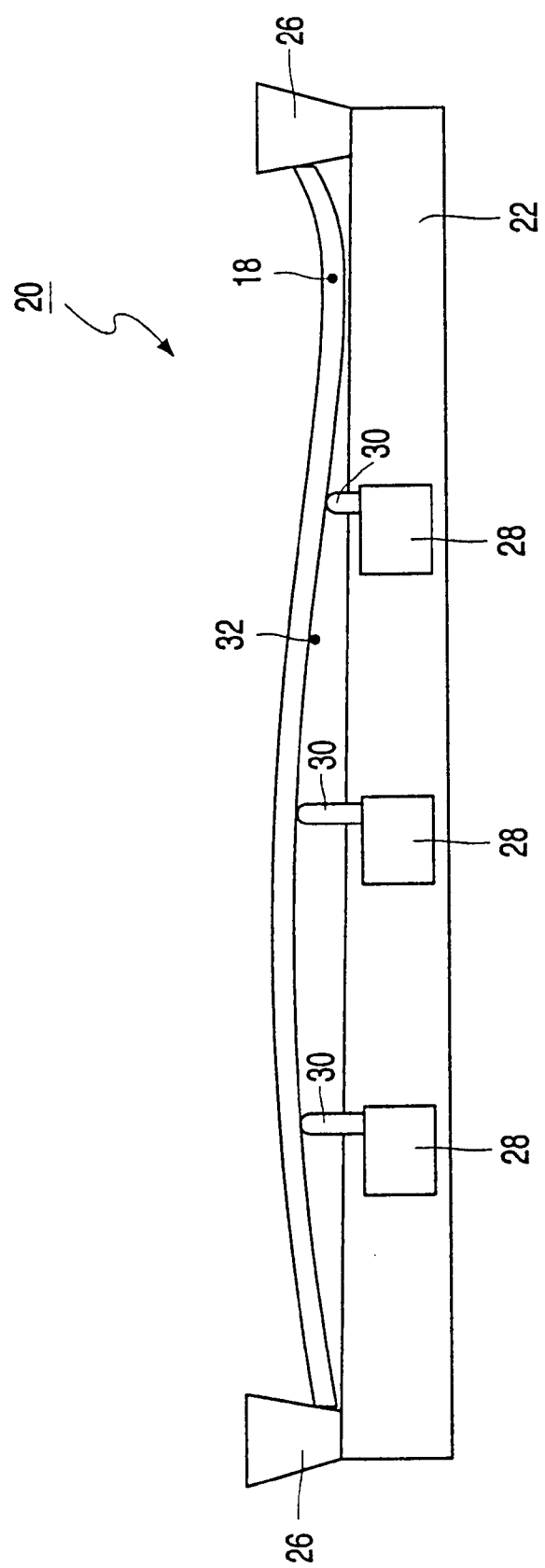
FIG. 2 is a diagrammatic side elevation of the object carrier according to the invention.

FIG. 2 is a diagrammatic side elevation of the object carrier 20 according to the invention. The object carrier shown includes a circular support body 22 which is sufficiently large so as to carry an object in the form of a semiconductor wafer 18 to be examined. In order to arrange the wafer 18 on the support body 22 without play, the latter body is provided with three cams 26 at its circumference (two of which are shown in FIG. 2), the shape of said cams being slightly tapered in the direction of the support body in order to press the wafer in the direction of the body 22 without play.

A number of support elements 28 is provided in the body 22. The desired number of support elements is dependent on the dimension of the wafer and on the expected degree of undesired vibrations in the wafer. For a wafer having a diameter of 30 cm, this number may be of the order of magnitude of thirty; however, a different number is by no means excluded. Each support element 28 is provided with a protrusion in the form of a pin 30 which is resiliently movable in the longitudinal direction of the pin as will be described in detail hereinafter with reference to FIG. 3.

The free ends of the pins 30 of the system of support elements 28 are intended to stay in contact with the wafer 18. To this end, together they define a substantially flat support surface 32 which corresponds to the lower side of the wafer to be supported. For the sake of clarity, the shape error of the wafer 18 relative to a flat surface is shown in exaggerated form in FIG. 2. When the wafer 18 suffering from shape errors is arranged on the object carrier 20, the projecting pins 30 are pressed against the lower side 32 of the wafer. In order to achieve the desired effect of the invention, the displacement stroke of the pins must be so large that each pin can press against the lower side of the wafer.

Figure 3A:
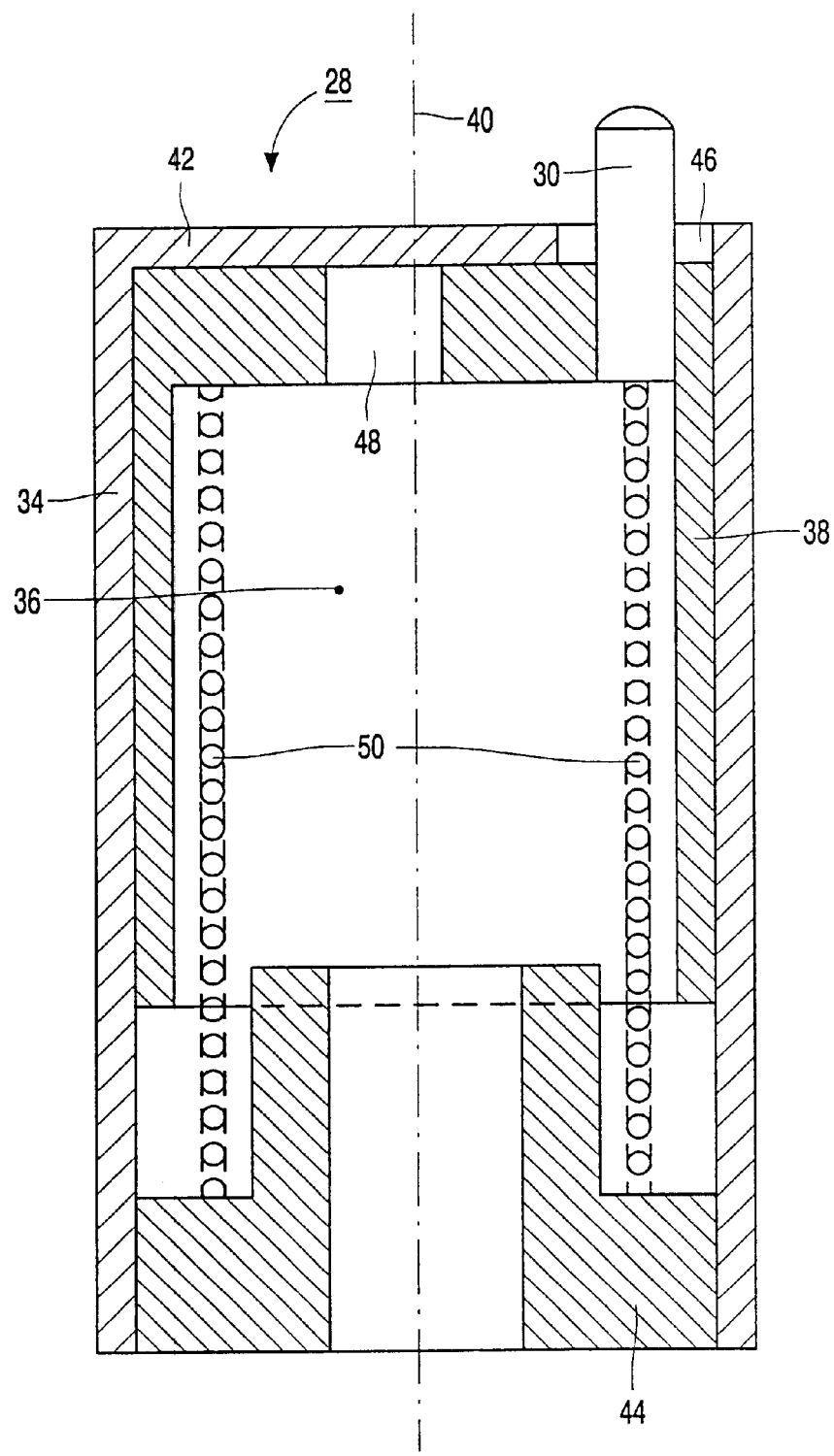
FIG. 3a is a sectional view of a resilient support element according to the invention.

FIG. 3a is a sectional view of a support element 28 according to the invention. The support element shown in this Figure includes a housing 34 which defines a cylindrical cavity 36. In this cavity 36 there is arranged a cylindrical body 38 which is movable within the housing and in the direction of the common cylinder axis 40. The upper side of the housing is closed by means of a lid 42 whereas its lower side is closed by means of a closing member 44. The pin 30 which is connected to the cylindrical body projects through an opening 46 in the lid 42 in the direction of the lower side 32 of the wafer. The cylindrical body is also provided with an opening 48 which is intended to allow the passage of air during the up and down movements, so that any air trapped between the lid 42 and the cylindrical body 38 cannot interfere with the movement of the member 38; this could occur if the wafer is arranged on the object carrier in atmospheric conditions. Inside the cylindrical body 38 there is provided a coil spring 50 which presses the cylindrical body in the direction of the wafer, with the result that the pin 30 remains in contact with the wafer surface 32. The force exerted on the relevant region of the wafer by the coil spring 50 should be smaller than the force caused by the weight of the relevant region of the wafer, so that the wafer will not be pressed out of the desired position. The spring 50 bears on the closing member 44 at the lower side. It is to be noted that the support element need not include a housing so as to implement the invention; it is alternatively possible to arrange the cylindrical body 38 directly in a bore in the carrier body 22.

Figure 3B:
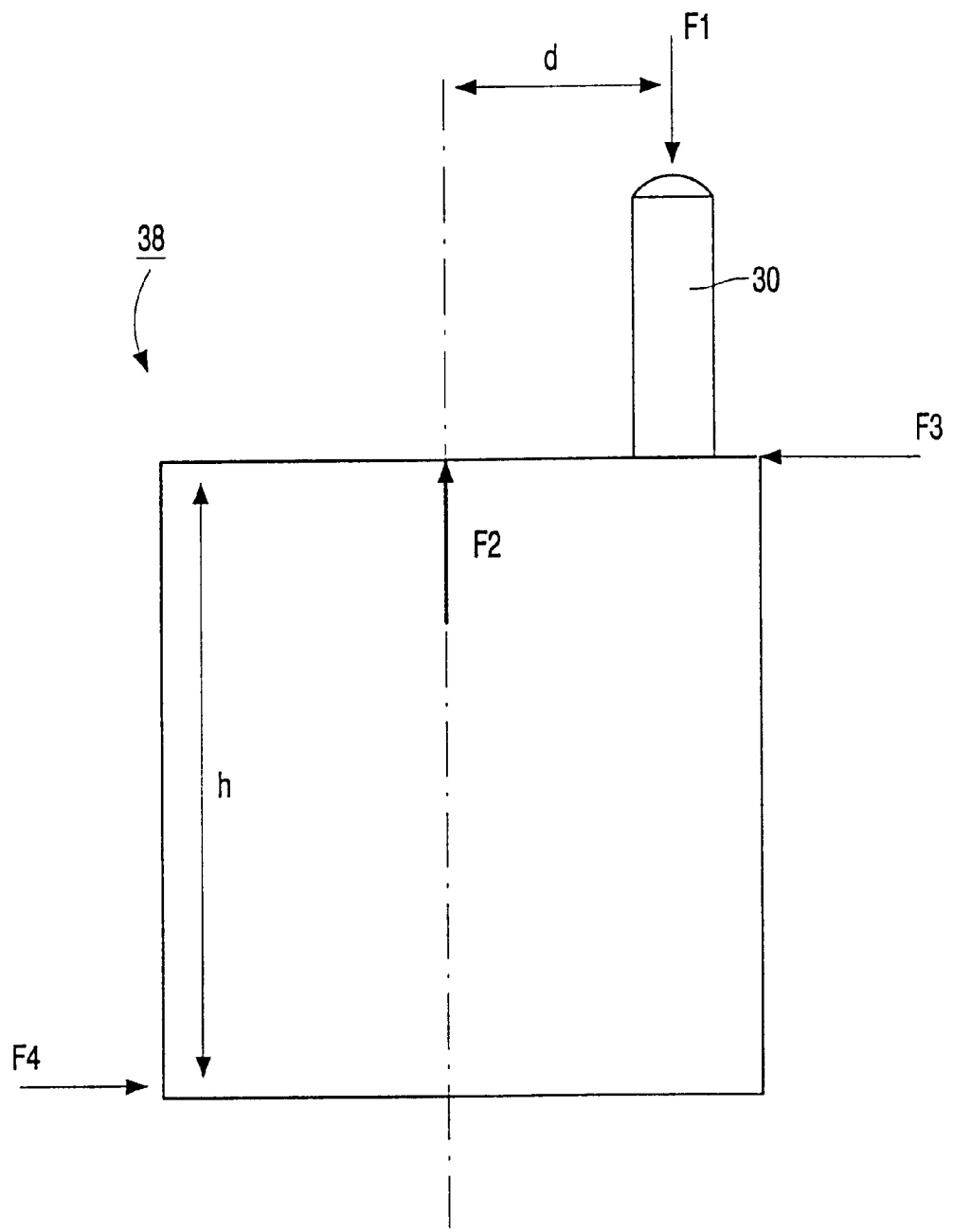
FIG. 3b is an auxiliary Figure for determining the desired friction in the support element.

The operation of the support element will be described in detail hereinafter with reference to FIG. 3b. When the wafer is arranged on the support elements, in each support element a force F1 is exerted on the pin 30 in the direction of the cylinder axis 40 when the pin 30 is depressed. Due to the action of the spring 50, an opposing force F2 which opposes F1 is thus produced. It is assumed that F2 acts at the center of the cylindrical body, i.e. along the cylinder axis 40. If desired, this situation can be reached by attaching the end of the spring 50 to the center of the body 38. Because the two forces F1 and F2 are not directed along the same line of action (the pin 30 is arranged so as to be eccentric relative to the cylinder axis), a moment is produced which must be compensated by a different moment in the state of equilibrium. Said other moment is produced by two reactive forces F3 and F4; F3 is applied to the upper side of the cylindrical body whereas F4 is applied to the diametrically oppositely situated lower side of the cylindrical body. The forces F1 and F2 are equal as regards magnitude, like the forces F3 and F4. The magnitude of these forces results from the requirement that the moment (F1+F2)d/2 produced by F1 and F2 should be equal to the moment (F3+F4)h/2 produced by F3 and F4. When the friction coefficient is known, the magnitude of the frictional force can be determined from the magnitude of the forces F3 and F4. The frictional force must satisfy two conditions: on the one hand, the frictional force should be smaller than a given maximum value so that the pin 30 always remains pressed against the wafer and cannot remain stuck in a lower position, irrespective of the angle of tilt of the wafer. On the other hand, the frictional force should be larger than a given minimum value so that it is large enough to counteract the tendency to vibrate of the part of the wafer supported by the relevant support element. In other words, the friction between the cylindrical body and the inner side of the housing 34 should be high enough to ensure that the pin 30, and hence the wafer 18, do not move under the influence of any vibration forces acting in the wafer. The intended effect of the invention is achieved by way of the latter choice of the magnitude of the frictional force. In that case no vibrations larger than the vibrations present in the entire construction, notably in the object carrier 20, can arise in the supported point of the wafer. The effect of the steps proposed according to the invention consist in that the support points formed by the pins 30 constitute elastic support points for macroscopic support of the wafer, which support points can follow the shape errors of the wafer; however, for motions in the nanometer range (so for the resonance vibrations) they constitute hard support points which do not allow such movements. It is to be noted that the opening 46 should be large enough to ensure that no friction of any significance is produced by the pin 30, because otherwise the friction between the cylindrical body and the inner side of the housing 34 will not be sufficiently defined.

Figure 4A:
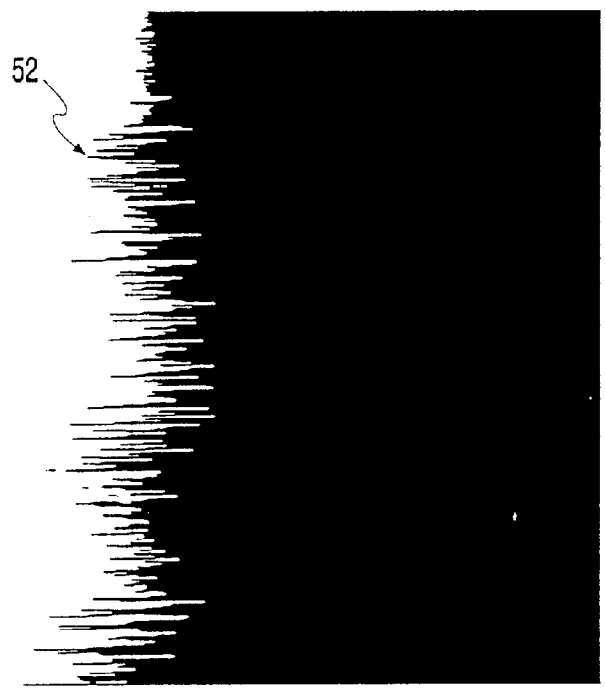
FIG. 4a is a rendition of an object which has been formed by means of a SEM, which object was supported by an object carrier according to the state of the art.
Figure 4B:
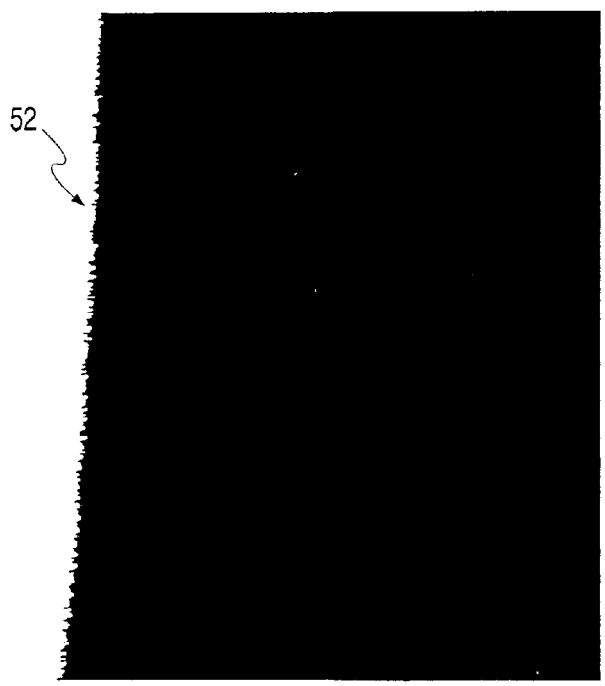
FIG. 4b is a rendition of an object which has been formed by means of a SEM, which object was supported by an object carrier according to the invention.

The FIGS. 4*a* and 4*b* illustrate the effect of the invention. Both Figures show an image of an object which has been formed by means of a SEM. The object consists in this case of a tin sphere having a diameter of the order of magnitude of from approximately 1 $\mu$m to 10 $\mu$m. Such tin spheres are provided on a wafer having a diameter of 30 cm; in FIG. 4*a* this wafer is supported by an object carrier according to the state of the art whereas in FIG. 4*b* it is supported by an object carrier according to the invention. The images show the edge of the sphere; thus, in the case of a vibration-free image a smooth edge would have to be reproduced. Comparison with the imaging scale 54 (representing a length of 50 nm) shows that in FIG. 4*a* the edge 52 was subject to vibrations of an amplitude of the order of magnitude of 25 nm. In FIG. 4*b*, i.e. the Figure relating to the invention, the same edge is subject to vibrations of an amplitude not higher than approximately 2 nm.

What is claimed is:

1. An apparatus for irradiating an object with a charged particle beam, the apparatus comprising:
   an object carrier for holding the object to be irradiated, the object carrier having a plurality of support elements for supporting the object, the plurality of support elements defining a surface to receive the object;
   wherein the plurality of support elements each have an elastic contact portion for supporting a separate part of the object, the elastic contact portions each having:
   (i) a primary force exerting toward the object to substantially maintain the contact portion in contact with the object while being irradiated; and
   (ii) a secondary force exerted on the contact portion that is small enough to prevent the contact portion from sticking below the object but large enough to stabilize the object under the influence of operational vibrations when the object is being irradiated.

2. The apparatus of claim 1, wherein each support element comprises a cylindrical body with the contact portion extending from an end of it, the cylindrical body being moveably mounted in a cylindrical cavity with a spring acting on the body for providing the primary force, and the cylindrical body being in frictional contact with the cylindrical cavity for providing the secondary force.

3. The apparatus of claim 2, wherein the cylindrical body has a central longitudinal axis, and the contact portion is eccentrically disposed relative to said central axis and projects toward the object.

4. The apparatus of claim 3, wherein the cavity is defined in a support element housing.

5. The apparatus of claim 3, wherein the cavity is formed from a bore in a carrier body that contains the plurality of support elements.

6. The apparatus of claim 1, wherein the primary and secondary forces are suitable to maintain support contact and adequately resist operational vibrations over a predefined range of operational beam/object tilt angles.

7. A carrier for supporting a an object to be irradiated by a charged particle beam, the carrier comprising:
   a carrier body adjustable for tilting the object to a desired tilt angle relative to the beam;
   a plurality of support elements mounted to the carrier body, each support element having a resiliently moveable protrusion extending away from the carrier body with each protrusion being disposed to supportably contact a distinct part of the object;
   wherein the plurality of protrusions substantially remain in supportable contact with the object when it is being irradiated regardless of the tilt angle, wherein each protrusion is (i) resiliently strong enough to substantially maintain contact with the object and to sufficiently resist being displaced when subjected to operating vibrations, but (ii) resiliently weak enough so as not to push the object away from the other protrusions.

8. The carrier of claim 7, wherein each support element includes:
   a housing fixed to the carrier body,
   a member slidably mounted within the housing, the member being slidable to and away from the carrier body, the protrusion being disposed at a distal end of the member away from the carrier body, and
   a spring mounted within the housing and coupled to the member to provide the protrusion with at least part of its resilience.

9. The apparatus of claim 8, wherein the spring applies to the member a force that is sufficient to maintain the protrusion against the object but small enough not to disengage the object from other protrusions, and the housing provides a frictional force against the member such that the member sufficiently resists displacement when subjected to operating vibrations.

10. The apparatus of claim 9, wherein the object is a wafer to be carried on its underside, the underside being irregularly shaped.

11. The apparatus of claim 8, wherein the housing and member have circular cross-sections.

12. The apparatus of claim 8, wherein the protrusion is off-center from the central axis of the member in the direction of movement.

13. A particle optical apparatus comprising:
   a beam source; and
   an object carrier for operably receiving an object to be irradiated by a beam generated from the beam source, the carrier including:
   (i) a carrier body adjustable to vary the tilt angle between the object and the beam over a range of operating angles, (ii) a plurality of support elements distributed on the carrier body to support an object, the support elements each including (1) a moveable member extending toward the object's under surface, the member having a contact portion at its distal end away from the carrier body to supportably contact the object underside, wherein the plurality of contact portions collectively support the object, (2) a spring mounted to the member to push it against the object, and (3) a cavity structure in frictional contact with the member when the object is being carried, (iii) wherein the spring provides sufficient force to maintain its associated member in contact with the object but weak enough so as not to push the object off of other member contact portions, and the frictional contact being sufficient enough to resist operable vibration but small enough so that the member does not stick below the object after being depressed.

14. The apparatus of claim 13, wherein the member functions as described in claim 17 over the range of operable tilt angles.

15. The apparatus of claim 13, wherein each support element further comprises a housing with a cavity that defines the cavity structure.

16. The apparatus of claim 15, wherein the housing is a cylindrical structure with a cylindrical cavity for slidably receiving the member, which has a corresponding cylindrical shape.

17. The apparatus of claim 16, wherein the contact portion is a pin extending out of the member at the distal end.

18. The apparatus of claim 17, wherein the pin extends out from the cylindrical member from an off-center position to create a moment sufficient to generate the frictional contact between the member and the housing.

* * * * *